United States Patent [19]
Letellier et al.

[11] 3,997,714
[45] Dec. 14, 1976

[54] SUPERCONDUCTIVE LEAD HAVING THIN STRIPS

[75] Inventors: Bernard Letellier, Antony; Jean-Claude Renard, Chilly Mazarin, both of France

[73] Assignee: ompagnie Generale d'Electricite, Paris Cedex, France

[22] Filed: May 14, 1975

[21] Appl. No.: 577,793

[30] Foreign Application Priority Data
May 29, 1974 France .............................. 74.18587

[52] U.S. Cl. .................................. 174/34; 29/599; 174/15 S; 174/117 F; 174/128 S
[51] Int. Cl.² ...................... H01B 7/08; H01B 12/00
[58] Field of Search ........... 174/15 S, 126 S, 128 S, 174/27, 34, 117 F; 29/599, 624

[56] References Cited
UNITED STATES PATENTS

| | | | |
|---|---|---|---|
| 3,397,084 | 8/1968 | Krieglstein ...................... | 174/126 S |
| 3,427,391 | 2/1969 | Bernert et al. ................... | 174/15 S |
| 3,432,783 | 3/1969 | Britton et al. .................. | 174/126 S |
| 3,634,597 | 1/1972 | Ziemek et al. ................... | 174/15 S |
| 3,643,002 | 2/1972 | Minnich .......................... | 174/15 S |
| 3,736,656 | 6/1973 | Aupoix ............................ | 174/15 S |
| 3,737,824 | 6/1973 | Coles ............................. | 174/126 S |
| 3,828,111 | 8/1974 | Berthet .......................... | 174/15 S |
| 3,864,508 | 2/1975 | Beck .............................. | 174/15 S |

*Primary Examiner*—Arthur T. Grimley
*Attorney, Agent, or Firm*—Haseltine, Lake & Waters

[57] ABSTRACT

Superconductive lead having several crossed or transposed filaments. A copper deposit, a superconductive deposit, a copper deposit, are formed successively on the surface of a support to constitute parts of stabilized filament, cupronickel deposits and further parts of stabilized filaments, to constitute several continuous filaments crossing one another and being electrically uncoupled from one another in the crossing zones by the insulating cupronickel deposits.

13 Claims, 22 Drawing Figures

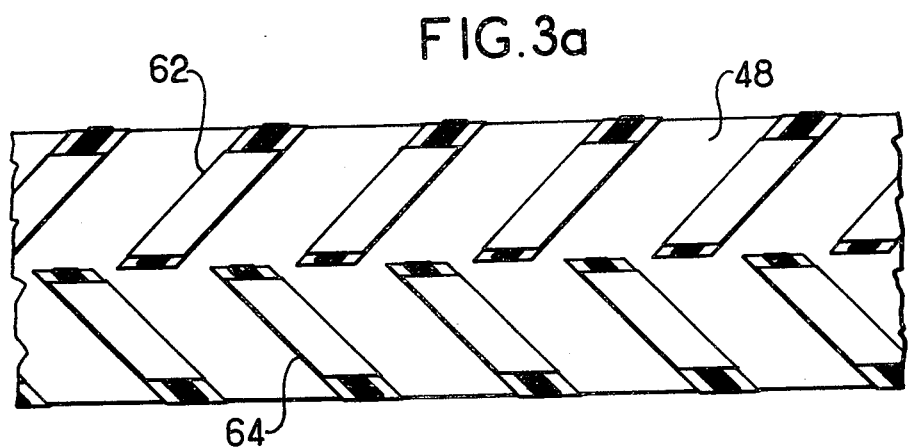
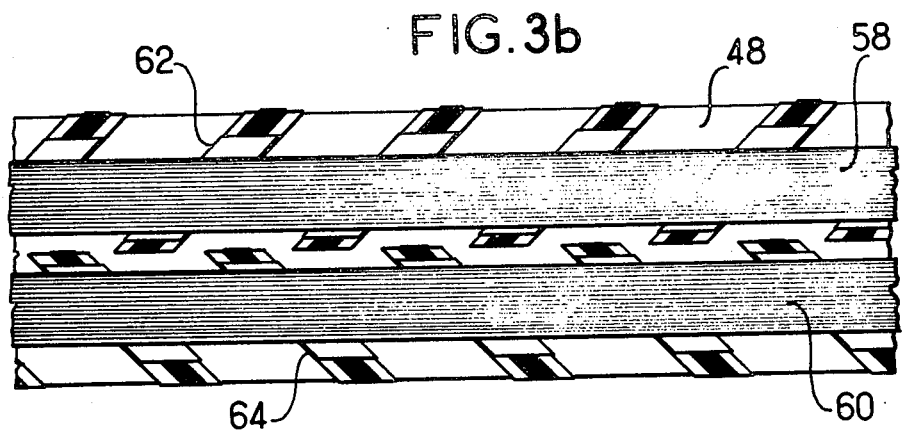
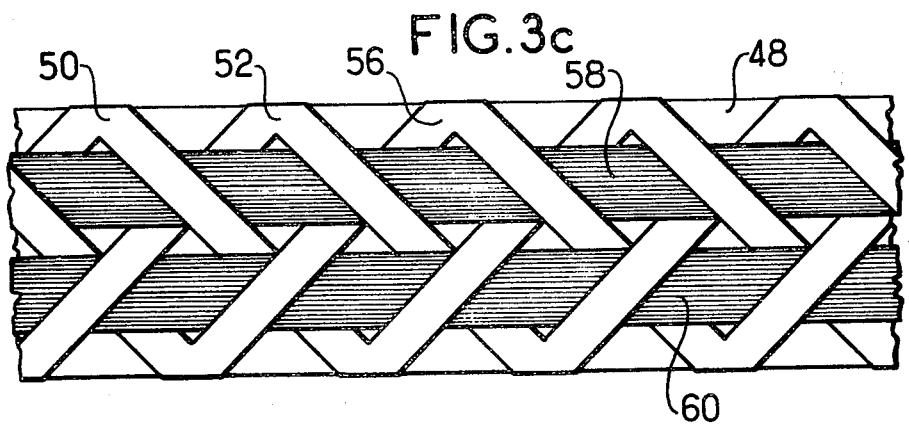

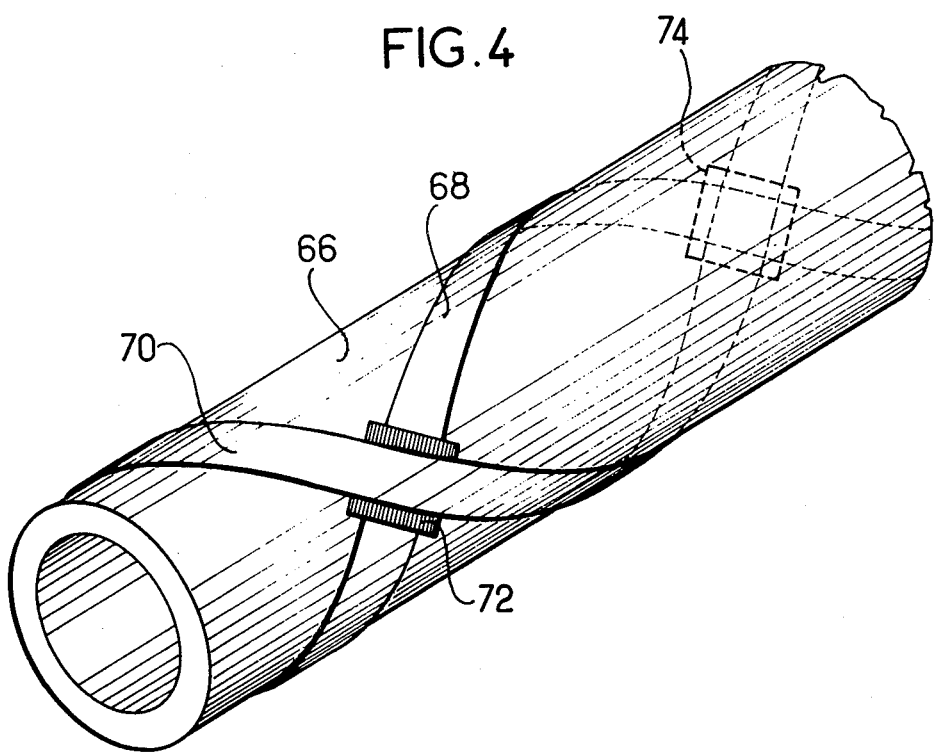

SUPERCONDUCTIVE LEAD HAVING THIN STRIPS

The present invention concerns a superconductive lead made of thin strips.

In the field of the conveying of electric energy by superconductive connections, the superconductive material should be stabilized, that is, it should be prevented from returning to the resistive state, also called the "normal" state, under the effect of thermal, electrical or magnetic disturbances which are more or less unavoidable. That is why, more particularly when high intensities of current are made to pass through a superconductive lead, the superconductive material is made in the form of several "filaments" having as small a cross-section as possible. Moreover, these filaments are covered with a casing constituted by a material which is a good conductor of electricity and heat, such as pure copper or pure aluminium.

It is, moreover, advisable, for compensating the electromotive induction forces, to intercross the filaments as much as possible. In the case where these filaments are obtained by simultaneous drawing through a draw plate, that intercrossing remains incomplete, for it can be obtained only by twisting. A transposition in the form of a plaited configuration nevertheless remains preferable.

Lastly, it is a known practice to coat the assembly formed by each filament and its casing which is highly conductive, with layers of a material which is a poor conductor, such as cupronickel, an alloy containing 55% of copper and 45% of nickel. In this way, the currents set up by electromagnetic induction in the loops which can be formed with two adjacent lengths of filament are reduced to a minimum, for each of these loops then comprises at least two lead-through bushings made of material of poor electrical conductivity, besides the lengths of the two adjacent filaments, as well as four highly conductive lead-through casings.

Moreover, methods are known for manufacturing several superconductive filaments in the form of thin strips wound in a helix on the surface of a support in the form of a ribbon so as to constitute a multi-filament ribbon which can thus be called a superconductive "lead", since it comprises several filaments and since it can be combined with other similar ribbons to form a superconductive cable. Such a ribbon is described in an American article by WILLARD D. COLES : "TWISTED, MULTIFILAMENT Nb3Sn SUPERCONDUCTIVE RIBBON" (NASA-TMX 68124 proposed for presentation at the Fourth International Conference on Magnet Technology, Upton, NEW YORK, SEPTEMBER 19–22, 1972). According to that article, several superconductive filaments made of a compound of tin and niobium are obtained by a deposit of tin on a same support ribbon made of niobium, through a mask previously fixed on the surface of that support. The superconductive lead thus formed by chemical reaction on the support has the disadvantage of being poorly stabilized and of not being transposed. As far as the manufacturing method is concerned it is suitable only with certain types of superconductive materials.

The present invention has as its aim the producing of a superconductive lead which is well stabilized and whose superconductive filaments can be made of a material having performances which are as high as possible, with a possibility of transportation when the number of these filaments is greater than two.

It has as its object a superconductive lead made of strips comprising:

A linear support,

And a superconductive filament having the form of a thin strip fixed on the surface of the said support, with a longitudinal direction incliined at least in places with respect to the longitudinal direction of that support, characterized in that it comprises, moreover:

A thin internal conductive strip and a thin external conductive strip of a highly conductive metal, colinear with the said filament and fixed, the one between the internal face of that filament and the said support, the other to the external face of that filament, respectively.

It has more particularly but not exclusively as its object, a superconductive lead having the preceding characteristics, the said superconductive filament and the said conductive strips being a "first filament" and "conductive strips of that first filament" characterized in that it comprises, moreover:

At least a second superconductive filament also fixed on the said support and crossing the said first filament in several crossing zones.

An internal conductive strip and an external conductive strip of the said second filament.

A thin insulating plate made of a material which is a poor conductor at each of the said crossing zones, that insulating plate being fixed between the said internal conductive strip of an internal filament and the said internal conductive strip of an external filament, the assembly by this internal filament and this external filament being constituted by the assembly formed by the said first and second filaments.

It has, moreover, as its object, a method for manufacturing a superconductive lead made of thin strips, characterized in that it comprises the following phases of depositing through openings in masks.

Depositing of parts of internal conductive strip on a linear support.

Depositing of parts of superconductive filaments having the form of at least one thin strip on the said parts of internal conductive strip.

Depositing of parts of external conductive strip on the said parts of filament.

The said masks being mobile in relation to the said support, so as to form at least one "stablized" filament constituted by a continuous superconductive filament between an internal conductive strip and an external conductive strip.

it has moreover more particularly but not exclusively as its object a method having the preceding characteristics, the said parts of filament deposited on parts of internal conductive strip, themselves deposited on the said support, being parts of "internal filament".

The parts of conductive strips between which there is a part of filament being parts of "conductive strips of that filament", characterized in that it comprises, moreover, the following phases for the forming of layers on the said support through the openings in the masks.

The forming of insulating plates on several zones of the said parts of external conductive strips on the said parts of internal filament.

Depositing of parts of conductive strips on the said insulating plates and on the parts of the said support which are not covered by the said parts of conductive strips of the said parts of internal filament, the parts of conductive strips thus deposited being parts of "internal conductive strips of external filaments".

Depositing of parts of "external" superconductive filaments on the said parts of internal conductive strips of external filaments.

Depositing of parts of external conductive strips on the said parts of external filaments.

The said masks being mobile, in relation to the said support, so as to form at least a first stabilized filament and a second stabilized filament each constituted by a continuous superconductive filament between an internal conductive strip and an external conductive strip and crossing each other in crossing zones coinciding with the said insulating plates, the set of these two continuous superconductive filaments being constituted in each of the said crossing zones by the assembly formed by the said parts of internal filament and parts of external filament.

With reference to the accompanying diagrammatic FIGS. 1 to 6, various embodiments of the invention will be described hereinbelow by way of an example having no limiting character.

Identical elements shown in several of these figures bear the same reference symbols therein.

FIGS. 1a, 1b, 1c, 1d, 1e, 1f, 1g and 1h show phases in the manufacturing of a first superconductive lead according to the invention.

FIGS. 2a, 2b, 2c, 2d, 2e, 2f, 2g, and 2h show various phases in the manufacturing of a second superconductive lead according to the invention.

FIGS. 3a, 3b and 3c show various phases in the manufacturing of a third superconductive lead according to the invention, that lead being transposed.

FIG. 4 is a perspective view of a third superconductive lead according to the invention.

Figure 1A:
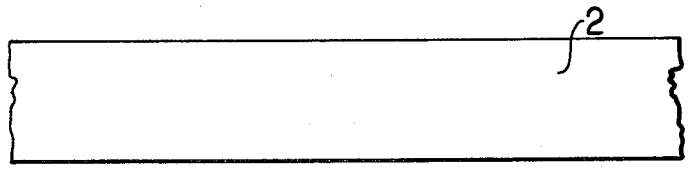

In FIGS. 1, 2, 3, and 4, only with a view to making it easier to understand the drawing, certain thin strips have been shown with one of their ends separated from their supports. It must nevertheless be understood that the nature of the method of manufacturing these strips does not make such separation possible.

Figure 5:
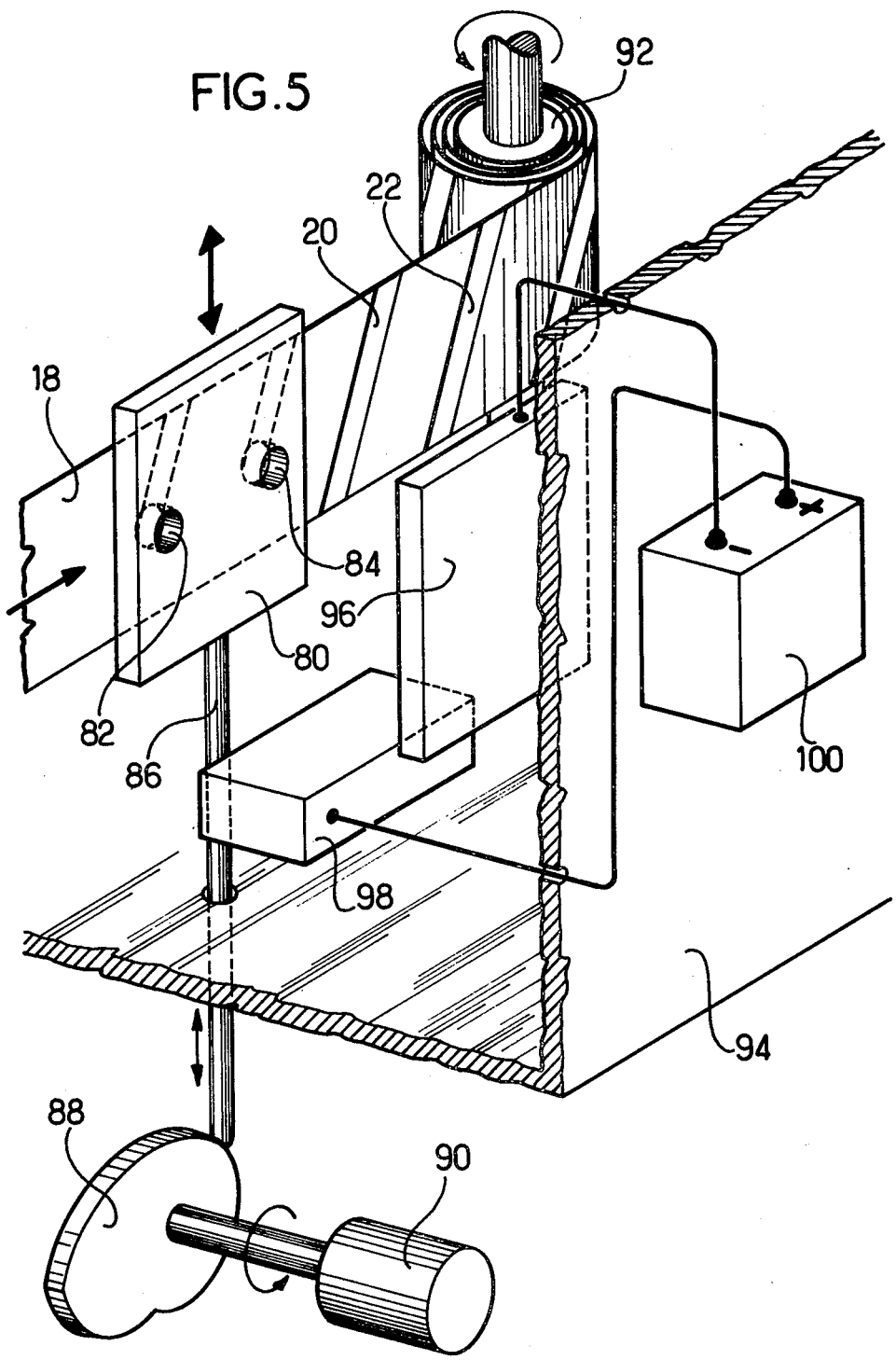
Figure 6:
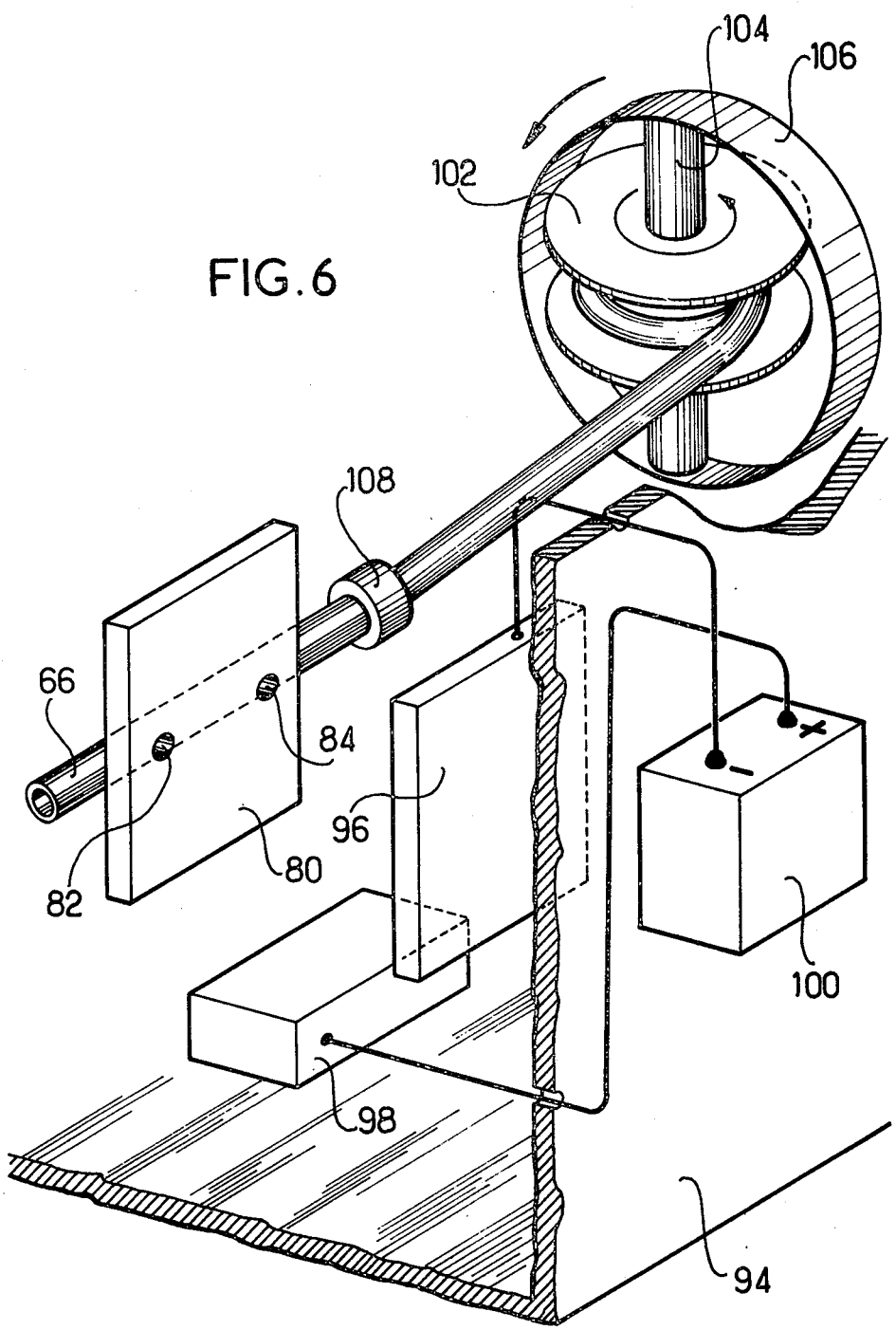

FIGS. 5 and 6 show two exploded perspective views of apparatus used for manufacturing the strips shown in FIGS. 3 and 4 respectively.

The superconductive lead described with the reference to FIGS 1a to 1h is a superconductive ribbon having two crossed filaments but it must be understood that, in practice, the number of filaments would be greater than two.

According to FIG. 1a, a stainless steel ribbon 2 constitutes the previously mentioned support, having a width of 1 cm and a thickness of 100 microns. Other identical metallic materials which are mechanically resistant and have high resistivity could also be used.

Figure 1B:
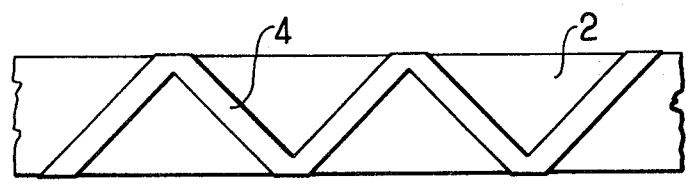

According to FIG. 1b, a continuous "internal" conductive strip 4 made of pure copper, having a thickness of 2 microns and a width of 0.7 mm has been deposited on one face of the support 2. That strip 4 is inclined with respect to the longitudinal direction of the support 2 and goes alternately and periodically from one edge to the other of that support, forming a symmetrical saw tooth pattern, with a pitch at least equal to the width of that support which can nevertheless be much greater, for example one meter.

Figure 1C:
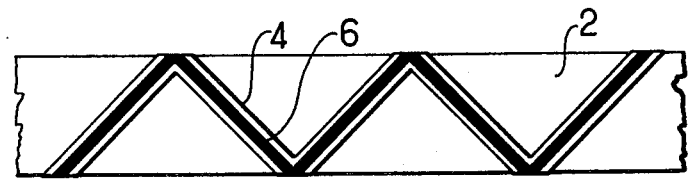

According to FIG. 1c, a superconductive "filament" 6 made of a strip of alloy of the "A 15" type such as $Nb_3Sn$, $Nb_3AlGe$, $Nb_3Ge$, $V_3Ga$, having a width of 0.5 mm and a thickness of 3 microns has been deposited on the strip 4, in its axis. Greater thicknesses would be an advantage, but would be difficult to obtain.

Figure 1D:
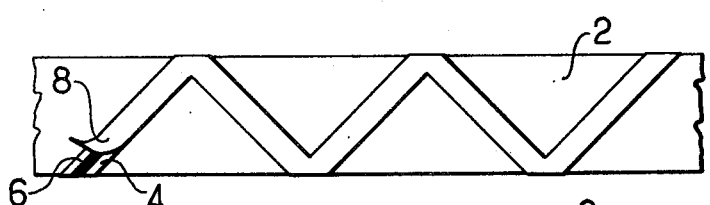

According to FIG. 1d, an "external" conductive strip 8 made of copper and identical to the strip 4, which it covers exactly, has been deposited on the filament 6.

Figure 1E:
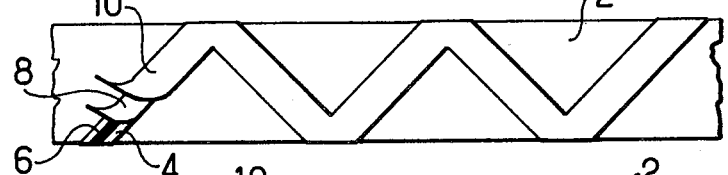

According to FIG. 1e, a strip 10 which is colinear with the strip 8 and which extends beyond each side of that strip has been deposited on the strip 8 and the support 2. The strip 10 has a thickness of 2 microns and a width of 0.9 mm. It is made of a metal alloy which is a poor conductor such as cupronickel. It could also be made of an insulant such as silicon monoxyde, but in that case, it should be removed from the ends of the superconductive lead to enable the electrical connecting thereof. It constitutes the insulating plates which have previously been mentioned and which form, here, a continuous strip.

In the following part of the description, it is preferable to call the filament 6 the "internal filament" and to call the strips 4 and 8 the "conductive strips of the internal filament", for they are combined with that filament, forming a conductive casing whch surrounds it.

Figure 1F:
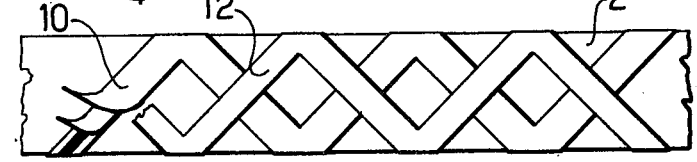

According to FIG. 1f, a conductive strip 12 has been deposited on the support and on the insulating strip 10. That conductive strip is identical to the strip 4 with respect to its shape, its composition and its path between th edges of the support 2, but it is staggered in relation to that strip 4 so as to reach the edges of the support 2 in the middle of the gap between the points where the strip 4 reaches those edges and so as to cross the strip 4 in a succession of crossing zones. On each length of the previously defined pitch, there are two such crossing zones.

Figure 1G:
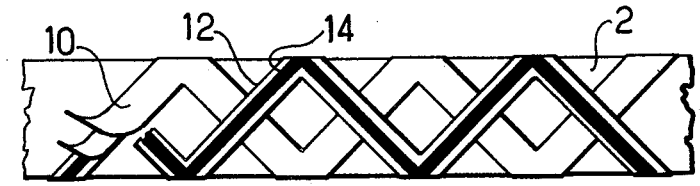

According to FIG. 1g, "external" superconductive filament 14 has been deposited exactly in the same way as the internal filament 6 was deposited on the strip 4. The strip 12 is the "internal conductive strip of that external filament".

Figure 1H:
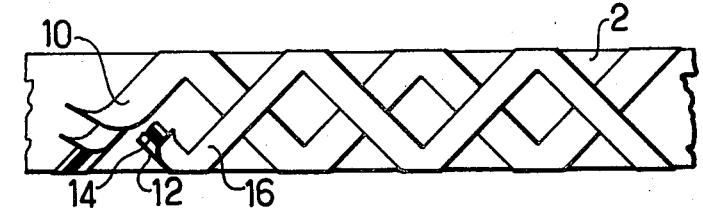

According to FIG. 1h, an "External conductive strip" 16 of the external filament 14 has been deposited on the filament 14 on the strip 12, that strip 16 being identical to the strip 12 and covering it exactly. Thus, a superconductive lead according to the invention comprising two crossed filaments, which are the internal filament 6 and the external filament 14 have been constituted.

With reference to FIGS. 2a to 2h, a superconductive lead in the form of ribbon having two "transposed" filaments will now be described. The materials used for the support, the conductive strips, the superconductive filaments and the insulating plates are the same as those which have been described with reference to FIGS. 1a to 1h, as are the thicknesses and widths of these various elements and the pitch of the alternate paths followed by the conductive strips and the filaments from one edge to the other of the support ribbon. This is also true of the superconductive leads which will be described with reference to FIGS. 3a, 3b, and 3c.

Figure 2A:
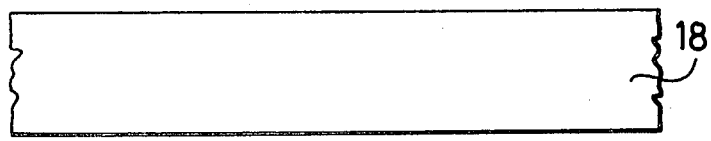

FIG. 2a shows a support 18 identical to the support 2.

Figure 2B:
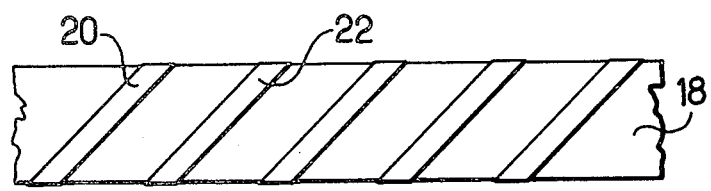

According to FIG. 2b, a succession of parts of "internal" conductive strips, such as the part 20 and the part 22, have been deposited on the support 18, these parts all being parallel and going from one edge of the support 18 to the other.

Figure 2C:
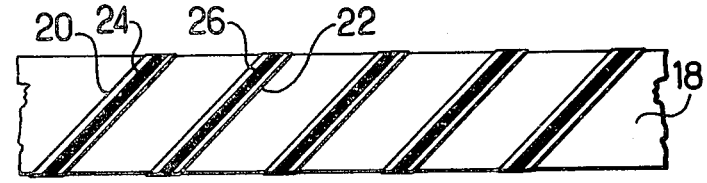

According to FIG. 2c, parts of "internal" superconductor filaments such as 24 and 26, going from one edge of the support 18 to the other, have been deposited on the parts of conductive strips such as 20 and 22 and their axis.

Figure 2D:
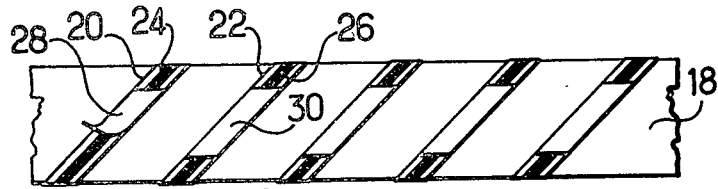

According to FIG. 2d, parts of "external" conductive strips such as 28 and 30, covering exactly the parts of internal conductive strips such as 20 and 22, but ending at a sufficient distance from each of the edges of the support 18 for it to remain possible, during a subsequent phase which will be described herebelow, to deposit further parts of superconductive filament connecting up with the parts of filament such as 24 and 26, have been deposited on the parts of filament such as 24 and 26 and on the parts of strips such as 20 and 22.

Figure 2E:
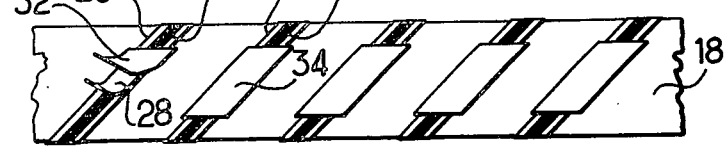

According to FIG. 2e, insulating plates such as 32 and 34 respectively have been deposited on the parts of external conductive strips such as 28 and 30, there being overlapping on the support 18 on both sides of the conductive strip.

Figure 2F:
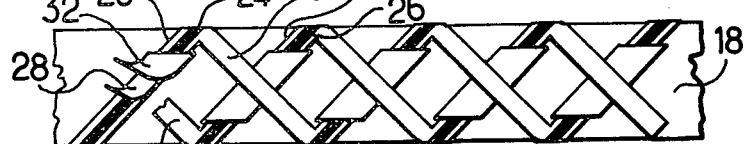

According to FIG. 2f, parts of conductive strips such as 36 and 38 respectively, which reach, at each of their ends, a part of conductive strip such as 22 and 20 respectively, in the vicinity of one of the edges of the support 18, overlapping slightly onto the latter part of conductive strip so as to establish connection, but without covering parts of internal filament such as 26 and 24 respectively, have been deposited on the insulating plates 18.

If it is assumed, to make the description easier, that the width of the support 18 is arranged vertically, each of the parts of strip such as 36 and 38 follows a path which starts from the top end of a first part of strip such as 20 and 22, passes on an insulating plate such as 32 and 34, above a second part of strip such as 20 and 22 and ends up at the bottom end of a third part of strip such as 20 and 22. The top end of each part of strip such as 20 is situated on the vertical line of the lower bottom end of a parallel and adjacent part of strip such as 22, so that the parts of strips such as 36 and 38 are inclined in a symmetrical way with the parts of strips such as 20 and 22 in relation to the vertical direction.

Figure 2G:

According to FIG. 2g, a part of "external" superconductive filament such as 40 and 42 respectively, connecting the top end of a part of internal filament such as 24 and 26 to the bottom end of another part of internal filament such as 24 and 26 has been deposited in the axis of each of the parts of strips such as 36 and 38. The parts of strips such as 36 and 38 are "parts of internal conductive strips of external filament". Thus, two continuous superconductive filaments have been constituted. A first filament comprises the part of internal filament 24 and the part of external filament 42 and a second filament comprises the part of internal filament 26 and the part of external filament 40. These two filaments cross each other at several crossing zones each coinciding with one of the insulating plates such as 32 and 34. In the zone of the plate 32, the first filament is internal and the second is external, whereas in the zone of the plate 34, the first filament is external and the second is internal.

Figure 2H:
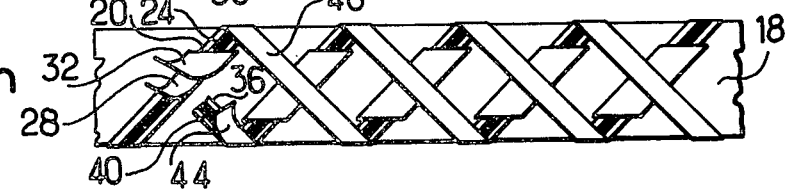

According to FIG. 2h, parts of external conductive strips such as 44 and 46 covering the parts of strips such as 36 and 38 and reaching the edges of the support 18 have been deposited on the parts of external filaments such as 40 and 42 and on the parts of strips such as 36 and 38. Thus, a superconductive ribbon having two transposed filaments has been constituted.

A superconductive lead in the form of a ribbon having three transposed filaments will now be described with reference to FIGS. 3a, 3b, and 3c. To simplify the description, the assembly formed by a superconductive filament and by its two conductive strips will be described as a "stabilized filament", it being understood that the indications given previously remain applicable with respect to the composition of such a stabilized filament, with respect to the three depositing phases necessary for that production and with respect to the method for connecting together the two parts of stabilized filament so as to establish the continuity of the conductive strips and of the superconductive filament.

According to FIG. 3c, three continuous stabilized filaments have been formed on one face of a support 48 in the form of a ribbon, whose width will be assumed to be vertical so as to make the description easier and whose length will be assumed to extend horizontally from left to right. These are a first, second and third filament 50, 52 and 56 respectively. Each of them goes alternately and regularly, periodically from one edge to the other of the support 48, forming a symmetrical saw-tooth pattern, with a staggering between two adjacent filaments equal to the third of the pitch. On each path of one of those filaments from one edge to the other of that support, there are two crossing zones with the other filaments, the one at the bottom third of the width of the support, the other at the top third. Two insulating strips 58 and 60, constituting the previously mentioned insulating plates, are arranged parallel to the length of the support 48 at the top third and bottom third of the width of that support, respectively. In each crossing zone, the two stabilized filaments which cross each other are completely separated from each other by one of those insulating strips. At each of the crossing zones corresponding to the strip 58 and looking from left to right, the internal filament is that which goes upwards and the external filament is that which goes downwards. On considering the strip 60, the internal filament is still that which goes downwards and the external filament is that which goes upwards, this ensuring the "transposing" of the filaments.

According to FIG. 3a, the process started with the depositing, on the support 48, of the parts of stabilized filaments such as 62 and 64, each limited by an edge and substantially by the middle axis of that support. These parts must constitute the internal halves of the stabilized filaments 50, 52 and 56, that is, the top halves such as 62 go upwards and towards the right and the bottom halves such as 64 go downwards and towards the right. At each of the ends of the parts of filaments such as 62 and 64, the external conductive strip is left set back so as to enable, during the subsequent phase, the connecting up of the superconductive filaments and of the bottom conductive strips to form a continuous stabilized unit.

According to FIG. 3b, the insulating strips 58 and 60 have been deposited on halves such as 62 and 64 and on the support 48.

According to FIG. 3c, the external halves of the stabilized filaments 50, 52 and 56 have been deposited on the strips 58 and 60 and on the support 48, ensuring the continuity of each of the conductive strips and of the superconductive filaments.

A superconductive ribbon having three transposed filaments has thus been obtained.

The superconductive lead having two transposed filaments shown in FIG. 4 is very similary to the one described with reference to FIG. 2. The number of filaments has been limited to two to make the description easier, but it could be greater.

The material used are the same, as are the thickness and the width of the conductive strips, superconductive filaments and insulating plates. The support is however not constituted by a ribbon but by a metallic tube 66 having a diameter of one to a few centimeters in which liquid helium can flow. A first stabilized filament 68 and a second stabilized filament 70, respectively following, on the cylindrical surface of the support 66, two paths having the same pitch, the one right-handed and the other left-handed. They cross each other in a succession of crossing zones every other one of which is situated on the side seen from the support 66, the others being on the hidden side. All the visible crossing zones are in a same first generatrix of the surface of the support 66 and all the hidden crossng zones are on a same second generatrix diametrically opposite to the first. In each of these zones, an insulating plate separates completely the first filament from the second. A visible insulating plate is shown at 72 and a hidden insulating plate is shown at 74. In all the zones corresponding to the visible plates such as 72, the first filament 68 is internal and the second filament 70 is external. In all the zones corresponding to the hidden plates as 74, the first filament 68 is external and the second filament 70 is internal. The manufacturing phases of such a superconductive lead having a cylindrical surface are similar to those which have been described with reference to FIGS. 2a to 2g.

The deposits of parts of conductive strips, superconductive filaments, insulating strips or plates previously mentioned can be formed, according to the invention, by cathode sputtering through openinngs in masks.

By way of an example, according to FIG. 5, the depositing of the parts of conductive strips 20 and 22 shown in FIG. 3b is effected through a mask drilled with two openings 82 and 84 and driven in a vertical downward movement by means of a push rod 86 and of a cam 88 driven in a rotating movement by a motor 90. The support 18 in the form of a ribbon runs horizontally behind that mask, being wound onto a take-up drum 92 having a vertical axis. The mask 80, the support 18 and the drum 92 are placed in an enclosure 94 provided for enabling the cathode sputtering of a material, copper, in this case, constituting a target 96 placed opposite the mask 80, the latter being placed between that target and the support 18.

According to a known method of the "triode" type, a plasma is created by a plasma generator 98 in the volume situated between the target 96 and the mask 80. An electricity supply source 100 brings the target 96 to a negative potential of 1000V in relation to the plasma. It is known that it is possible to obtain, thus, depositing speeds of approximately two microns per hour, in the case of both copper and cupronickel and of three microns per hour for the superconductive material. The width of the deposited strips is equal to the diameter of the holes 82 and 84. Only one mask and two holes have been shown, but it is quite evident that to accelerate the depositing, it is an advantage to increase the total number of holes, this enabling the simultaneous depositing of a greater number of parts of strips. The position and the inclination of the deposited strips are obviously determined by the position of the holes 82 and 84 and by the horizontal movement speeds of the support 18, 1 cm per hour, for example and the vertical speed of movement of the mask 80, 1 cm per hour, for example, if it is required to obtain a step of 2 cm with an inclination at 45°. Of course and contrary to what has been shown for the sake of clearness in the drawing, it is advisable to effect simultaneously several different depositing operations, making a support such as 18 pass in front of a succession of depositing devices each comprising at least a mobile mask such as 18, a target such as 96 and a plasma generator such as 98 and all situated in a same vacuum enclosure such as 94.

According to FIG. 6, the depositing of the stabilized filaments shown at 68 and 70 in FIG. 4 is effected in conditions very similar to those in FIG. 5, but the masks such as 80 are fixed and the support 66, which has a cylindrical surface is driven in a helical movement about its axis. For that purpose, a take-up drum 102, as well as a pay-out drum, not shown, rotates not only about its axle 104 perpendicular to the axis of the support 66, but also, through a circular frame 106 bearing the axle 104, about an axis situated in the extension of the axis of the part of the support 66 situated behind the mask 80. A guide 108 ensures the guiding of the support 66 in the vicinity of the mask 80.

We claim:
1. A superconductive lead made of thin strips comprising: an elongated support having a longitudinal axis; and a superconductive filament having the form of a thin strip fixed on the surface of said support with a longitudinal direction inclined at least in places with respect to the longitudinal axis of that support; a thin internal conductive strip and a thin external conductive strip of a highly conductive metal and colinear with said filament, one strip being fixed between the internal face of said filament and said support, and the other strip being fixed to the external face of said filament, respectively.

2. A superconductive lead according to claim 1 wherein said superconductive filament and said conductive strips are respectively a first filament and conductive strips of that first filament, at least a second superconductive filament being also fixed on said support and crossing said first filament in several crossing zones; an internal conductive strip and an external conductive strip of said second filament; a thin insulating plate made of a material which is a poor conductor at each of the said crosing zones, the insulating plate being fixed between said external conductive strip of an internal filament and said internal conductive strip of an external filament, the assembly formed by said internal filament and said external filament comprising the assembly formed by the said first and second filaments.

3. A superconductive lead according to claim 2 wherein in all the crossing zones, said internal filament comprises said first filament and the said external filament comprises said second filament.

4. A superconductive lead according to claim 2 wherein in predetermined crossing zones said internal filament comprises said first filament and said external filament comprises said second filament, in other said crossing zones, said internal filament comprising said second filament and said external filament comprising said first filament.

5. A superconductive lead according to claim 1 wherein each of said two conductive strips extends beyond the two sides of said filament.

6. A superconductive lead according to claim 1 wherein said support is in form of a ribbon; said filament being fixed on a single face of said ribbon and alternating from one edge to the other of said face.

7. A superconductive lead according to claim 1, wherein said support has a cylindrical surface; said filament being wound in a helical configuration on said cylindrical surface.

8. A superconductive lead according to claim 1 wherein said superconductive strips are made of a material selected from the group consisting of pure aluminum and pure copper; said insulating plates being made of a material selected from the group consisting of cupronickel and silicon monoxyde.

9. Method for manufacturing a superconductive lead made of thin strips comprising the following phases of depositing through openings in masks: depositing parts of internal conductive strip on a linear support; depositing parts of superconductive filaments having the form of at least one thin strip on said parts of internal conductive strip; depositing parts of external conductive strip on said parts of filament; said masks being mobile in relation to the said support, so as to form at least one stabilized filament constituted by a continuous superconductive filament between an internal conductive strip and an external conductive strip.

10. Method according to claim 9 wherein said parts of internal conductive strip are themselves deposited on the said support and comprise parts of internal filament; parts of conductive strips between which there is a part of filament comprising parts of conductive strips of that filament, the following steps for forming layers on the said support through the openings in the masks comprising: forming insulating plates on several zones of the said parts of external conductive strips of the said parts of internal filament; depositing parts of conductive strips on said insulating plates and on parts of said support which are not covered by said parts of conductive strips of said parts of internal filament, the parts of conductive strips this desposited comprising parts of internal conductive strips of external filaments; depositing parts of external superconductive filaments on said parts of internal conductive strips of external filaments; depositing parts of external conductive strips on said parts of external filaments; said masks being mobile in relation to the said support so as to form at least a first stabilized filament and a second stabilized filament each comprising a continuous superconductive filament between an internal conductive strip and an external conductive strip and crossing each other in crossing zones coinciding with the said insulating plates, the set of said two continuous superconductive filaments being comprised in each of said crossing zones by the assembly formed by said parts of internal filament and parts of external filament.

11. Method according to claim 9, wherein said support is in form of a ribbon, said masks being driven in alternating linear movements parallel to the width of the said support; said support being driven in a longitudinal movement.

12. Method according to claim 9, wherein said support has a cylindrical surface and is driven in relation to said mask in a longitudinal movement and a rotating movement about its axis.

13. Method according to claim 9, wherein the said deposits are effected by cathode sputtering.

* * * * *